United States Patent [19]

De et al.

[11] 4,371,754

[45] Feb. 1, 1983

[54] AUTOMATIC FAULT RECOVERY SYSTEM FOR A MULTIPLE PROCESSOR TELECOMMUNICATIONS SWITCHING CONTROL

[75] Inventors: Bimal B. De, Naperville; Lawrence G. Gierut, Lockport; Herbert B. Krakau, Elmhurst; Kirit Naik, Hanover Park; Eddie Tan-Atichat, Westmont, all of Ill.

[73] Assignee: Rockwell International Corporation, El Segundo, Calif.

[21] Appl. No.: 208,360

[22] Filed: Nov. 19, 1980

[51] Int. Cl.³ .................. G06F 11/20; H04M 3/08
[52] U.S. Cl. .................. 179/18 EE; 371/9; 371/10
[58] Field of Search ........... 179/18 EE; 371/9, 10; 370/13, 16

[56] References Cited

U.S. PATENT DOCUMENTS 3,409,877 11/1968 Alterman et al. ......... 179/18 EE X
4,256,926 3/1981 Pitroda et al. .................. 179/18 ES

OTHER PUBLICATIONS

"Fault-Tolerant Design of Local ESS Processors", W. N. Toy, *Proceedings of the IEEE*, vol. 66, No. 10, (Oct. 1978), pp. 1126-1145.
"System Recovery in the 2B Processor", Argoe and Wilber, *GTE Automatic Electric Journal*, Jul., 1979, pp. 141-148.
"Stored Program Multiregister", Mucientes et al., *Electrical Communication*, vol. 54, No. 4, 1979, pp. 271-280.
"A New System Handles Cross-Connections", J. R. Colton, *Telephony*, Dec. 8, 1980, pp. 74-82.
"The DMS-100 Distributed Control System, Fault Tolerance, Digital-Style", Bourne et al., *Telesis* (Bell-Northern Research, Canada), vol. 7, No. Four, 1980, pp. 6-12.

*Primary Examiner*—Thomas W. Brown
*Attorney, Agent, or Firm*—V. Lawrence Sewell; Howard R. Greenberg; H. Frederick Hamann

[57] ABSTRACT

An automatic fault recovery system for a multiple processor control complex of a telecommunications switching system is disclosed. The fault recovery system has a hierarchical structure which deals with the occurrence of soft faults and localizes insofar as possible the effect of errors, with the goal of minimizing disruption of calls through the switching system. Included in the steps taken by the recovery system are rewriting memory locations in active memory units from standby memory units, switching between active and standby copies of memory units, bus units and central processor units, and instituting progressively more pervasive initializations of all the processors in the control complex. The recovery system includes an arrangement employing a memory block parity check for fast initialization. A time shared error detection and correction activity assures that standby copies of memory units are in condition to become active when required.

29 Claims, 15 Drawing Figures

AUTOMATIC FAULT RECOVERY SYSTEM FOR A MULTIPLE PROCESSOR TELECOMMUNICATIONS SWITCHING CONTROL

BACKGROUND OF THE INVENTION

This invention relates to a telecommunications switching system, and more particularly to automatic fault recovery in such a system.

U.S. Pat. No. 4,146,749 to Pepping et al. and U.S. Pat. application Ser. No. 842,091 of Pitroda et al. (now Patent No. 4,256,926) describe a telecommunications switching system controlled by a complex of multiple microprocessors. The system provides a number of standby or spare portions which can be switched into operation in the event of a malfunction. The present application is generally concerned with the automatic switching of such spares. In particular, the present application is directly concerned with the switching between duplicate processors, buses, memory modules, etc. of the control complex as disclosed in the Pitroda et al. application, rather than the spare network block of the Pepping et al. patent.

The general object of the present invention is to provide a system which can isolate the source of a detected error, in some cases correct the error and in other cases reconfigure the operation of the system appropriately. There are several major factors which influence the solutions conceived to attain this objective. For one thing, the control complex in which all of this is to be carried out, is made up of multiple processors, rather than a single multiprogrammed processor. Secondly, it is difficult to analyze soft faults, arising from noisy components, as opposed to hard faults due to a totally failed component. Thirdly, it is highly advantageous to minimize the disruption of the large number of communications which may be connected through the switching system. The importance of these factors in the present invention will become apparent upon a consideration of the detailed disclosure below. Because these factors are present in other kinds of systems, the teachings of the present invention can have applicability beyond the switching system described in the Pepping et al. patent and the Pitroda et al. application.

SUMMARY OF THE INVENTION

In accordance with one aspect of the invention, there is provided a hierarchical system for responding to errors. Each of the various processors which make up the control complex can be duplicated in its various components, including the CPU, the bus structure and the memory modules. The most localized response of the system is to correct an error by such steps as rewriting the contents of a memory location or by reloading a selected portion of the memory of one processor. If errors persist, the next level of response is to replace a selected component such as a CPU or memory module by its standby. If there are still problems, the system moves to reload, for all the processors, portions of the memories of which can possibly permit system recovery without interrupting telephone call connections currently made by the switching system. If a satisfactory recovery does not take place, the next level of response is to reload the memories of all the processors, including portions which when reloaded will interrupt telephone connections currently made by the system. The preceding two levels wherein memories for all processors are reloaded can be performed much faster, if a block of memory to be reloaded is first checked for parity errors. Then only those blocks exhibiting such parity errors need actually be reloaded. However, if the latter method is used, and errors still persist in the system, then the final level of recovery response is to totally reload the memories of all the processors, without selectivity based on apparent errors such as parity.

In a particular aspect of the invention, there is provided a system for recovering from the occurrence of a Return Data Parity Error (RDPE) accompanying a read from a memory address. The system writes into the memory address of the active memory module with data obtained from the same address in the standby module, in an attempt to correct the fault and to determine whether it is a hard or soft fault. In the case of a soft fault, the system keeps count of the occurrences of this error and when a certain number have occurred switches the standby CPU of the processor to active status in an attempt to cure the problem. On a further accumulation of soft fault errors, the relevant standby memory module is switched to an active status.

In another aspect of the invention, each processor is provided with a software system for routinely checking the contents of the standby copy of memory to assure that the standby copy is ready for use when required. The system operates in a time shared relationship with call processing to check the standby contents for parity errors and to compare the contents of standby and active. If necessary, the standby is rewritten with the contents of the active copy.

DESCRIPTION OF A PREFERRED EMBODIMENT

Figure 1:
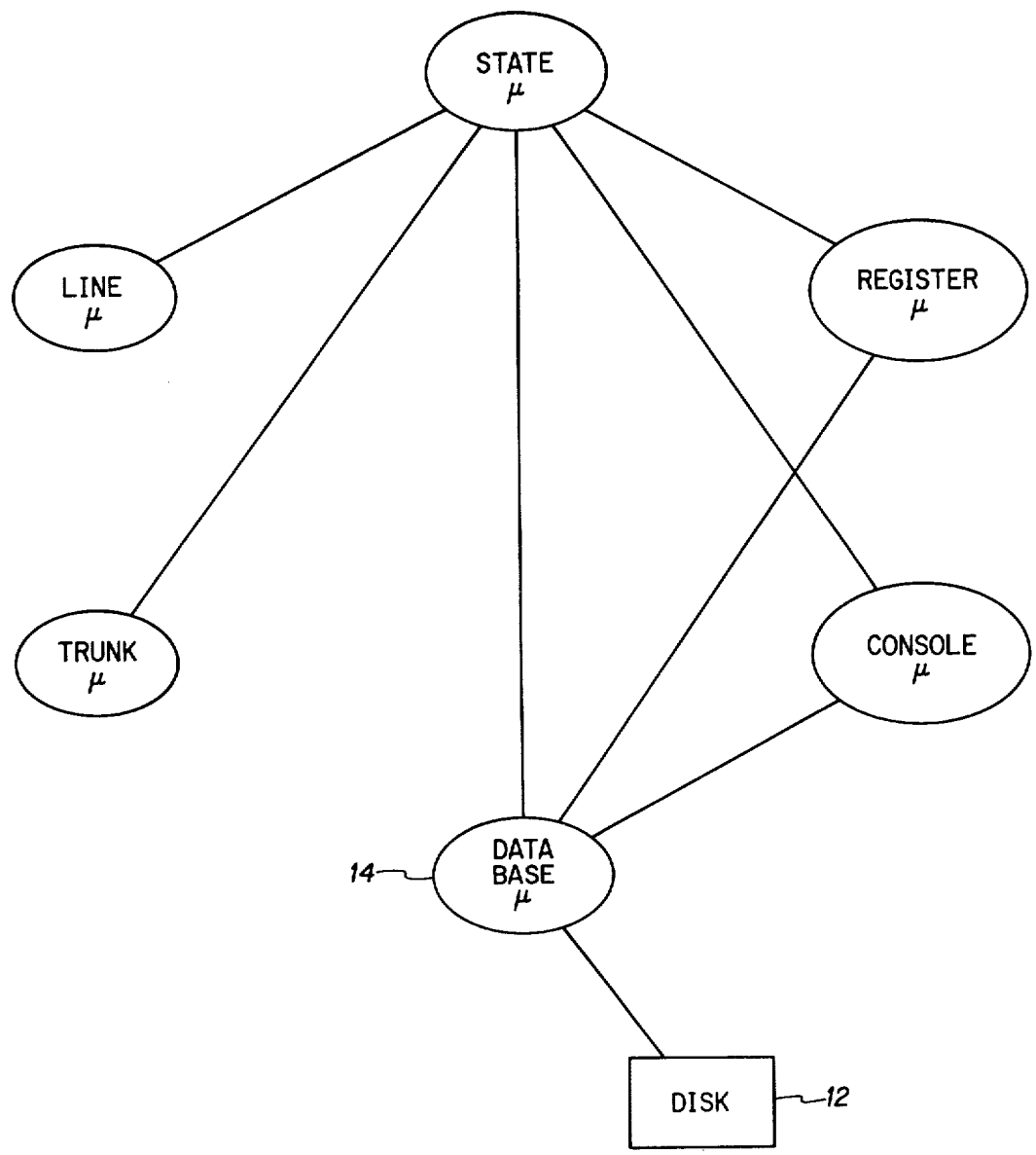
FIG. 1 is a block diagram of the switching system control complex employing the fault recovery of the invention.

FIG. 1 illustrates the multiple processors which form the control complex for the switching system described in the Pitroda et al. application. The roles of the various processors and their communication with each other through interprocessor buffers are described in that application. In FIG. 1, there is shown a floppy disc unit 12 which contains the information that is loaded into the memories of the control processors to initialize the system and place it in a condition to receive incoming calls. The data base processor 14 is in communication with disc 12 and administers the loading of the processor memories from the disc. The figure indicates that the data base processor is in direct communication with the console, register and state processors. The data base processor communicates with the line and trunk processors via the state processor.

Figure 2:
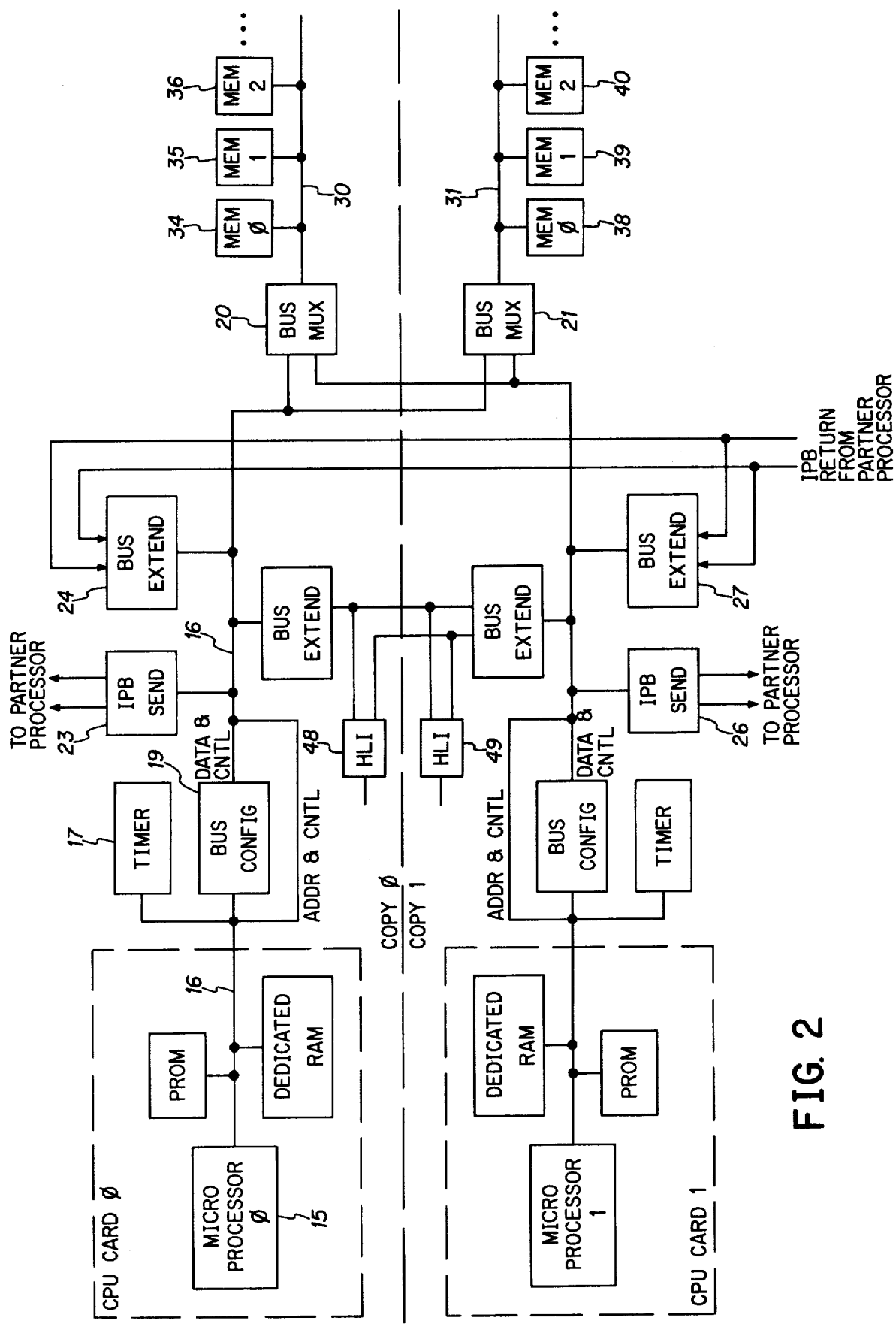
FIG. 2 is a block diagram of one of the processors in the diagram of FIG. 1.

Each of the processors of FIG. 1 has the configuration shown in FIG. 2. There are two copies of each component, so that one can operate as active and the other as standby. Referring to the copy 0, it is seen that on a printed circuit card with the microprocessor 15 itself are a PROM and a dedicated RAM. The PROM contains program steps necessary to reinitialization and reloading of the processor memory. The dedicated RAM is useful as a temporary memory under certain recovery circumstances which will be described below. The microprocessor communicates with these memories and its other associated components by means of a bus 16. A timer card 17 contains among other circuits a hardware watchdog timer, to which further attention will be directed below. A bus configuration circuit 19 exercises control over the data portion of the bus and, particularly relevant to the present application, sends control signals to the memory bus multiplexers 20 and 21. As indicated by the figure, the bus configuration circuit sends its data and control bus information to both copies 20 and 21 of the bus multiplexers.

In operation, one of the CPU copies is active, while the other acts as a standby. It is the active CPU which must communicate with its partner processors through interprocessor buffers, as described so extensively in the Pitroda et al. application. Thus, for example if the CPU copy 0 is active, it communicates with the interprocessor buffer connections of a partner processor through the interprocessor buffer send section 23 and bus extender 24. If CPU copy 1 becomes the active copy, then the interprocessor buffer send section 26 and bus extender 27 will be active in permitting communication with the partner processor.

In normal operation, the active CPU is connected duplex to the memory buses 30 and 31. The active CPU performs a write to both memory buses, and thereby to all the memory modules of the processor, excepting any which may have been switched to a troubled state because of an identified malfunction. When the active CPU performs a read, however, it reads only from those memory modules in the active status. These are not necessarily all on the same memory bus. For example, memory modules 34, 39 and 36 might be in an active status, while modules 38, 35 and 40 are in standby status.

It is possible to have the memory modules along one memory bus in different active/standby statuses, because the status latches are on the memory modules themselves. The active CPU writes to a selected memory module two data bits which set the module in an active, standby or trouble (out of service) status. The status bits set latches on the module which operate through gates to prevent a module in standby status from being read, even though it may be written to.

There is a complication in the process of switching one copy of the memory module from active to standby and the other copy from standby to active. This arises from the fact that in the normal duplex operation, the status bits would be written to both copies, marking them both active or both standby. Accordingly, it is necessary to switch to a simplex mode of operation in which the active CPU writes only to a selected one the memory buses. This is accomplished by the active CPU writing to the bus configuration circuit data bits which tell whether only copy 0 of the memory bus is to receive data from the CPU, or only copy 1 of the memory bus, or both. The bus configuration circuit commands the bus multiplexers to appropriately gate the data coming to them from the CPU.

Figure 3:
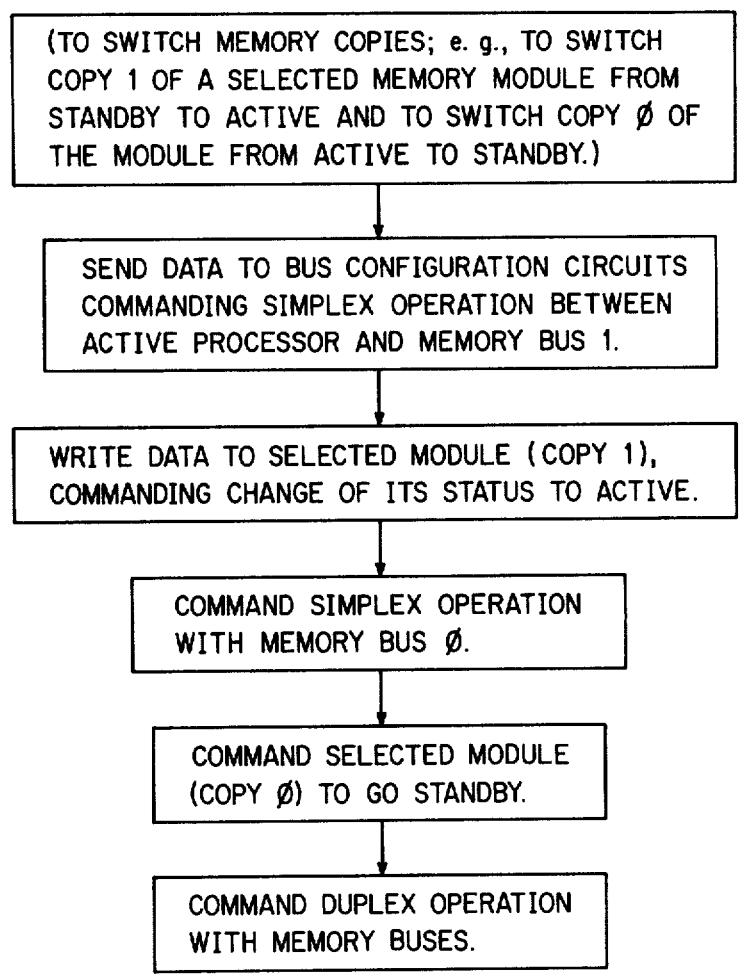
FIG. 3 is a flow chart of the steps for switching memory copies.

FIG. 3 shows the steps necessary to effect a switch between memory copies. For example, if module 40 (copy 1) is currently standby and module 36 (copy 0) is currently active, then simplex operation with respect to memory bus 30 is commanded in order to change module 36 to standby, and simplex operation with respect to bus 31 is commanded in order to switch module 40 to active. After the status of the modules has been changed, the active CPU commands a resumption of duplex operation, writing to all modules, but reading only from the active ones such as newly active module 40.

Figure 4:
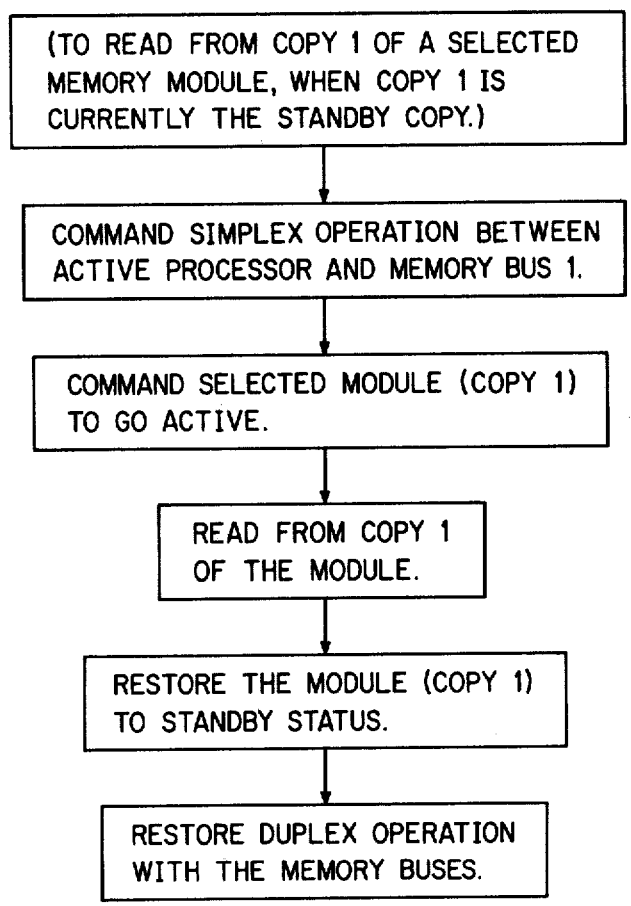
FIG. 4 is a flow chart of the steps for reading from the standby copy of memory.

It will be readily recognized that the similar steps must be taken any time there is a need to read from the standby copy of a memory module, such as occurs frequently in attempts to correct errors. FIG. 4 illustrates the required steps. If, for example, copy 1 is the standby copy, then the active CPU must command simplex operation with memory bus 1 and temporarily designate the module which is to be read from as active. After the completion of the read, then the module is restored to standby status and the memory buses are returned to duplex operation.

Figure 5:
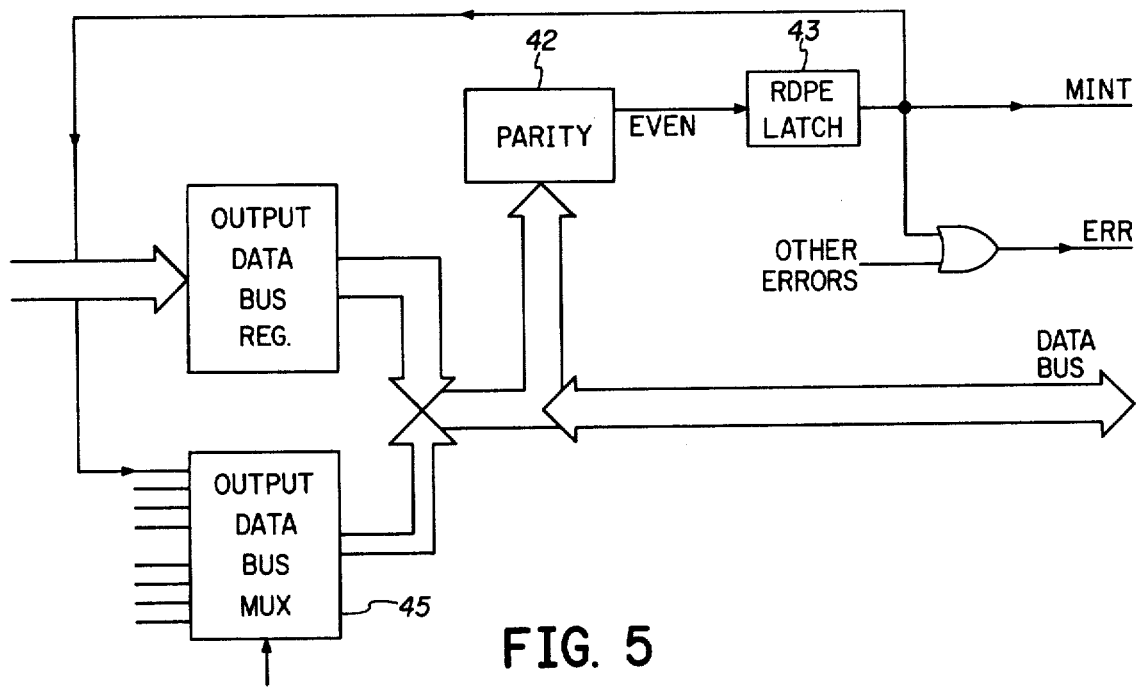
FIG. 5 is a block diagram of return data parity error circuitry.

One of the principal errors dealt with by the system of the present invention is a Return Data Parity Error (RDPE). This error occurs when a CPU commands a read from memory and the returning data is discovered to have bad parity. The parity check is carried out in the bus configuration circuit, as illustrated in FIG. 5. The bits of the data bus are brought to a parity circuit 42. In the case that the data return from memory is of even parity, a latch 43 is set and interrupt MINT is sent to the timer card. The output of RDPE latch 43 is made available to the data bus through a multiplexer 45, whereby it can be checked subsequently by the CPU.

Figure 6:
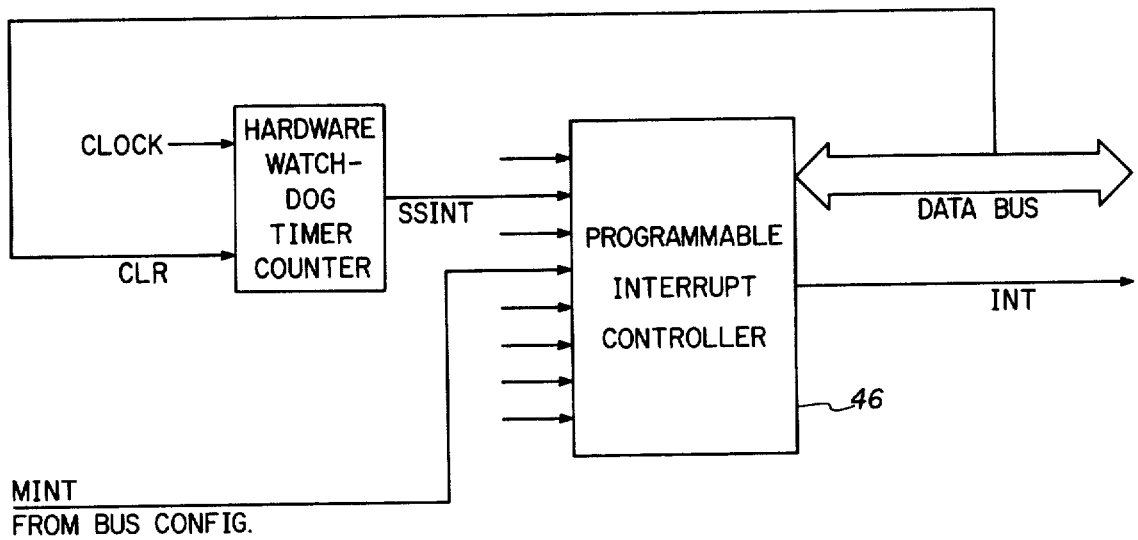
FIG. 6 is a block diagram of interrupt handling circuity, including a hardware watchdog timer.
Figure 7:
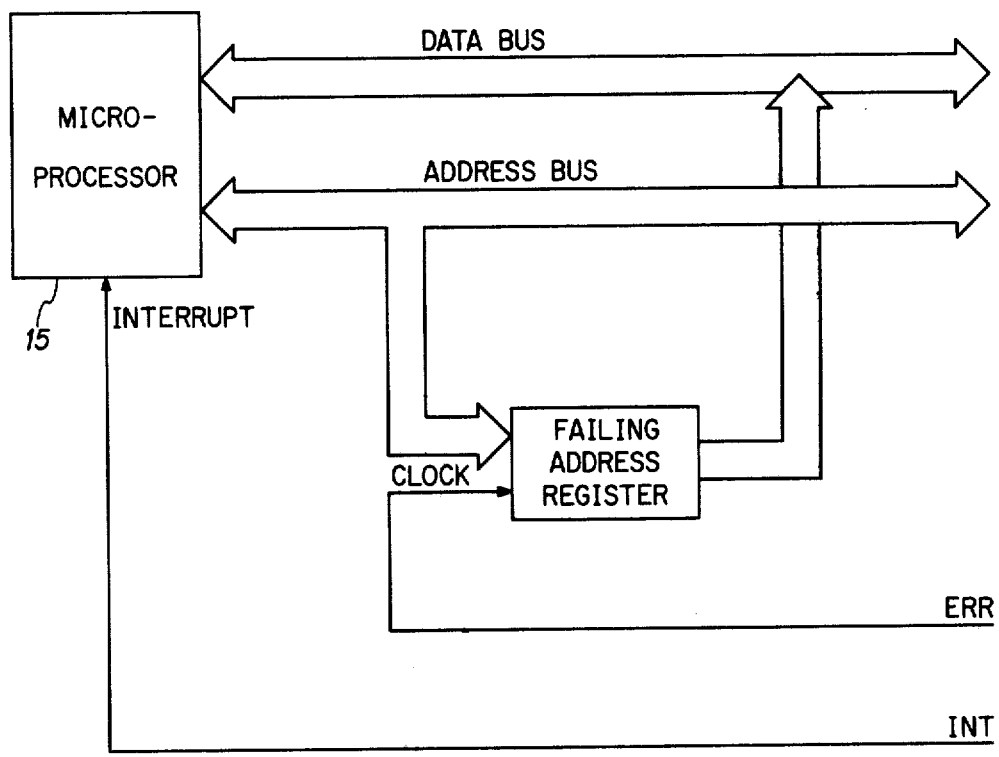
FIG. 7 is a block diagram of a circuit for saving a failure address in the event of a return data parity error.

FIG. 6 shows some details of the timer card 17 (FIG. 2) relevant to interrupts. A programmable interrupt controller 46 receives the interrupt MINT from the bus configuration circuit as one of its inputs. The controller 46 can be for example an Intel 8259. Upon receiving the interrupt MINT, the controller 46 generates an interrupt which is sent to the microprocessor 15 as shown in FIG. 7. In addition, controller 46 sends on the data bus an opcode and address which effectively tell the microprocessor the first instruction to execute in response to the RDPE interrupt. As can be seen in FIG. 5, the occurrence of the MINT interrupt also generates a signal ERR which goes to the CPU card circuitry shown in FIG. 7 to clock the contents of the address bus into a failing address register. In this way, the CPU saves the address at which the read was being performed, when the parity error occurred.

Response to Return Data Parity Errors

When a CPU is performing a read to its memory and is interrupted because of an RDPE, it seeks to determine whether there is a hard or soft fault. A hard fault, which will predictably repeat, leads more quickly and easily to a localization of the fault. In order to deal with soft faults, a troubleshooting CPU keeps a count of the number of the parity errors which have been detected, taking various actions at various cumulative error counts. The actions taken are based on the assumption that there is only one fault source at a time. Properly employed, this system can prevent overreacting to noise and transients, while leading to a location of real faults.

Figure 8:
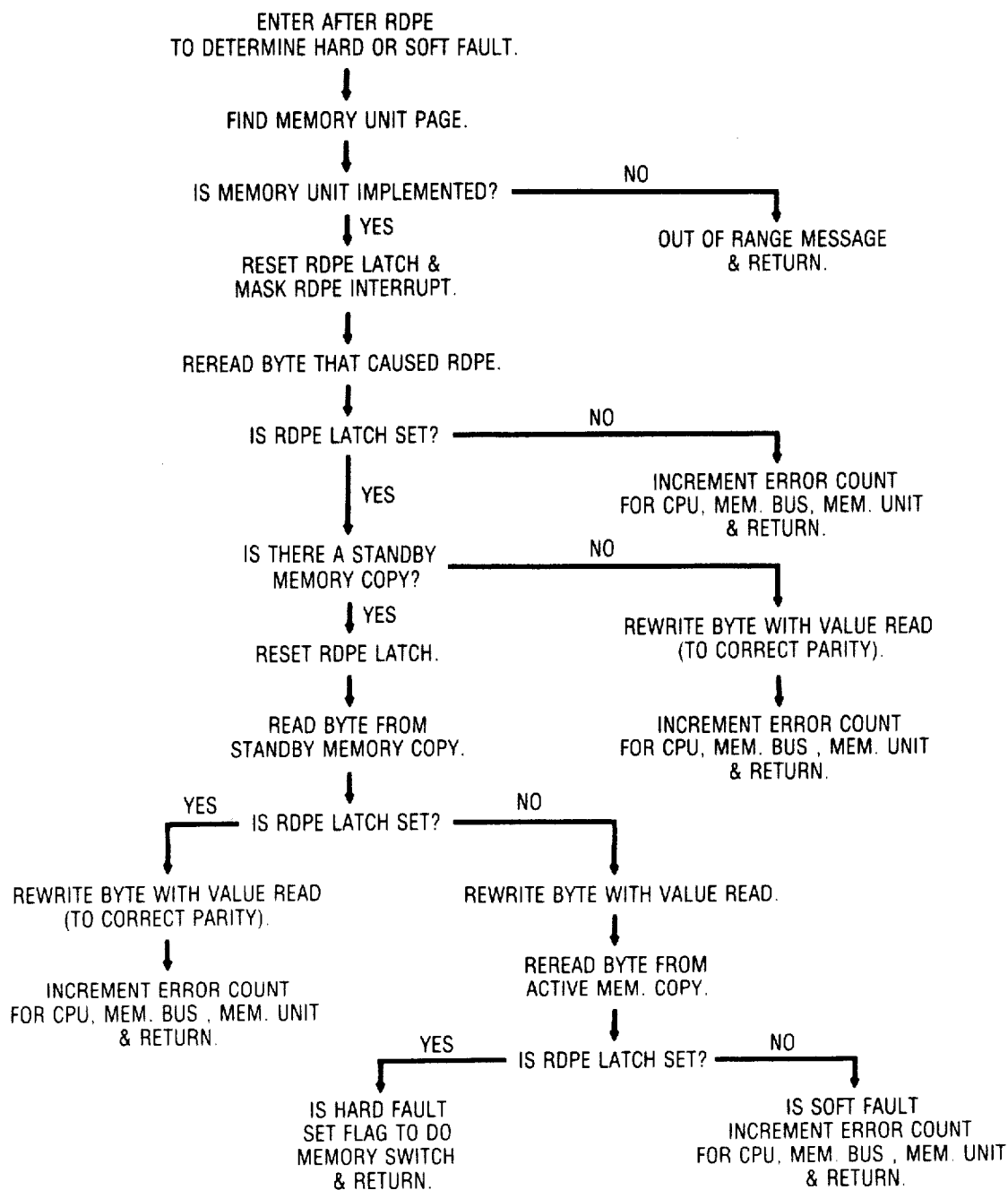
FIG. 8 is a flow chart of steps for determining whether a return data parity error represents a hard or soft fault.

In FIG. 8, after the CPU determines the memory unit page associated with the error, it checks to be sure that there is actually a memory module plugged in at the address of the attempted read. Then it resets the RDPE latch on the bus configuration circuit (FIG. 5) and masks the RDPE interrupt by sending appropriate command to the programmable interrupt controller 46 (FIG. 6) on the timer card. This allows the CPU to continue its troubleshooting routine after the occurrence of additional RDPE errors, without branching to the entry point of the RDPE interrupt handler routine.

The CPU then commands a new read of the memory location that caused the RDPE and examines the RDPE latch 43 (FIG. 5) to see if a parity error occurred during the new read. If the RDPE is not set, then the problem has not recurred. It is not classified either as a hard fault or a soft fault, but the error count is incremented. Separate error counts can be kept for errors which seem to be attributable to the CPU, to the memory bus or to the particular memory unit; here all are incremented. Then the CPU returns to its other operations, unmasking the RDPE interrupt as it does so.

If the RDPE latch is set after the first reread, the CPU resets the RDPE latch and reads the same byte from the standby memory copy. After the read the RDPE latch is examined again.

If the latch is set after reading from the standby memory module, once again the fault is classified neither as hard nor soft, but the error count is incremented. The byte read from the standby unit, right or wrong, is rewritten in duplex in an effort to store a number with the correct parity.

If there was no RDPE error upon reading from the standby unit, then the byte read from standby is rewritten duplex to correct the parity of the memory contents. Then there is another attempt to reread the byte from the active memory copy.

IF the RDPE latch is set after this last read, then the active memory copy has given three return data parity errors in a row, the last one after a correction of the data in memory by write. This is classified as a hard fault in the active memory module. A flag is set to do a memory switch of this module to standby, and the other copy to active. The CPU returns to the routine of FIG. 9, where it determines whether there is a standby memory copy ready to operate. If so, the memory switch is completed and control goes to the CPU executive. If there is not standby memory available, then the system must stay in its present configuration and attempt to run, merely giving an error message to a craftsperson.

If the RDPE latch is not set after the last mentioned read in FIG. 8, then the fault is classified as a soft one. The error count is incremented, and the control returns to the routine of FIG. 9.

Figure 9:
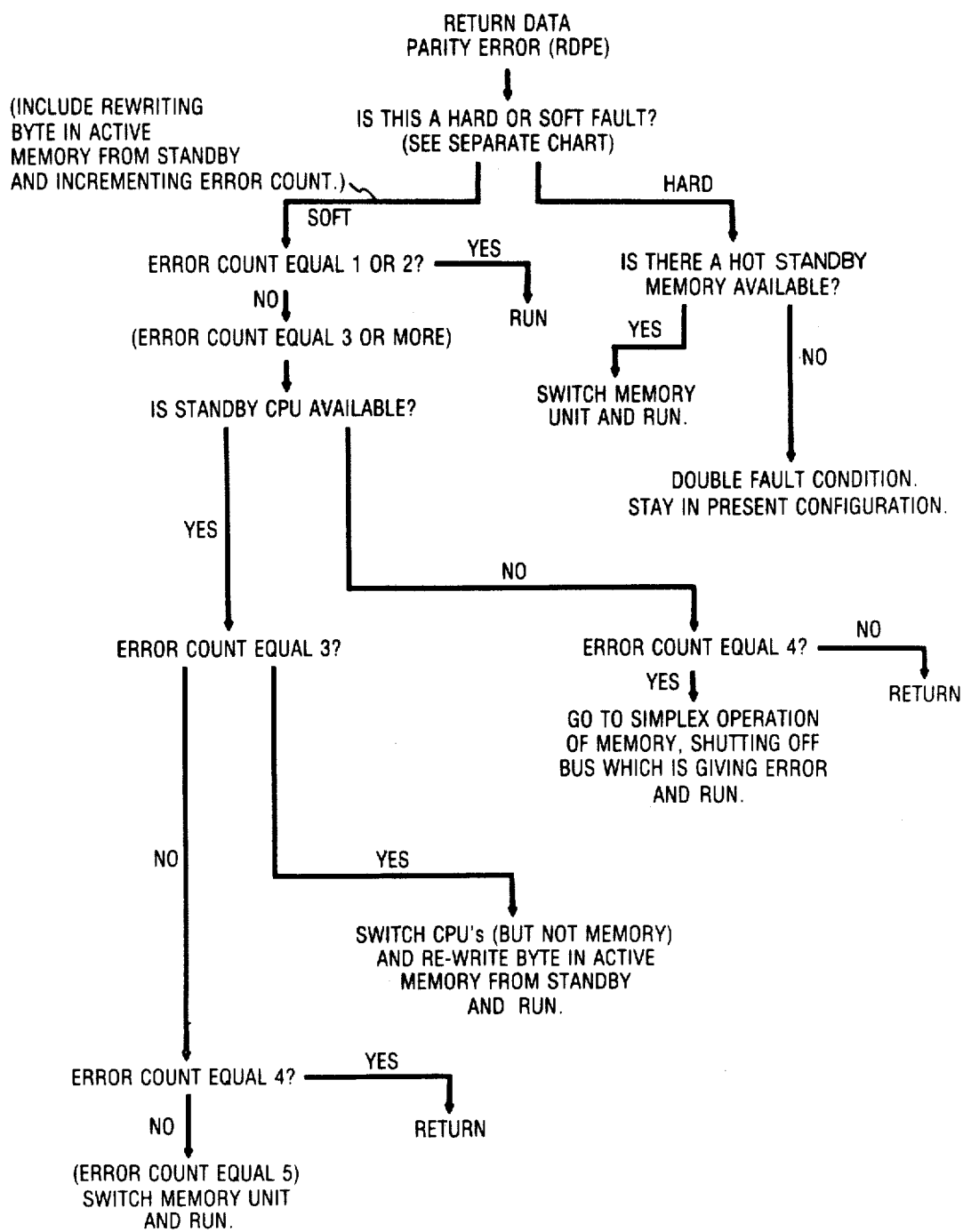
FIG. 9 is a flow chart of a processor routine for responding to return data parity errors from memory.

Considering the flow chart of FIG. 9 further, it is seen that after a determination of a soft fault, that nothing more is done if there have been only one or two error counts. Program control moves to the executive. Upon an error count of three or more, the routing seeks to switch to the other CPU copy. Some of the factors influencing this action are that it has not been possible by means of the hard/soft fault test to firmly establish the active memory module as being at fault. If there is no standby CPU implemented, then the active CPU simply resumes executive functions on the third error count. On the fourth count, it switches to simplex operation, shutting off the memory bus which is generating the RDPE. This necessitates appropriate switching to ensure that all the active modules are copies located on the bus which is in simplex operation.

If there is a standby CPU available, then the switch of CPU's is made on the third error count. The memory byte giving the error is read from standby and rewritten duplex for correction purposes. The newly configured processor resumes call processing. If there is a fourth error count, it is the first one for the new CPU configuration, so no immediate action is taken other than the rewriting inherent in the hard/soft determination routine. Finally, on the fifth error count the memory unit generating the error is switched to standby, and its copy is switched active. At this point then both the CPU and memory unit have been switched. If a period (e.g. 15 minutes) elapses without switching of copies, then the error counts for the various components are set to zero.

Figure 10:
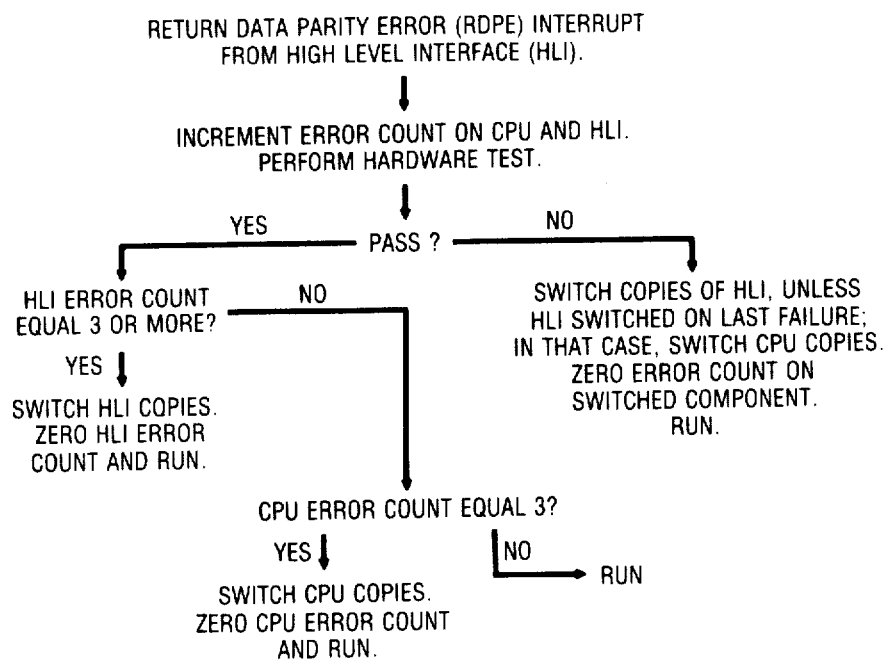
FIG. 10 is a flow chart of a processor routine for responding to return data parity errors from a high level interface.

FIG. 10 shows the handling of return data parity errors from the high level interface (HLI). The high level interfaces, indicated by reference numerals 48 (copy 0) and 49 (copy 1) in FIG. 2 are interfaces between the control complex and the network portion of the switching system. They are described in some detail in the Pepping et al. patent.

In responding to interrupts from the HLI, there are hardware tests which can be ordered by the CPU on the high level interface. If the HLI fails the test then there is alternately ordered a switching of the copies of the HLI or the CPU. If the hardware test is passed, then the HLI is switched when its error count reaches three, and the CPU is switched if its error count is three or more. There is a consistency in that three is the number of error counts on which CPU switching occurred in the routine for responding to a memory RDPE. In fact, the error count for the CPU can be incremented either from the HLI parity error routine or from the memory parity error routine, or others not included in the present description. This allows an accumulation of evidence that it is the CPU which is at fault.

Other devices can generate an RDPE. The response of the system to an RDPE interrupt generated by the dedicated RAM is to switch CPU's immediately, since it is known that the problem is on the CPU card. If an interprocessor buffer read causes an RDPE, the error count of the CPU is incremented, and CPU's are switched at an error count of three, as in other cases.

Hardware Watchdog Timer Response

The hardware watchdog timer is another means for signaling an error condition. The hardware watchdog timer counter itself is on the timer card and is shown in FIG. 6. In a specific embodiment, the counter receives clock pulses at five millisecond intervals and is connected so that it will generate an output after receiving 32 such pulses, if not cleared. Accordingly, the watchdog timer counter must be cleared within 160 ms, or it will generate an output SSINT which forms an interrupt input to the programmable interrupt controller 46. The software of each processor has a step which is routinely performed which writes to the timer card to clear the watchdog timer counter. This routine clearing of the counter should occur in considerable less than 160 milliseconds under proper operating conditions. However, if the CPU becomes hung in some state or loop, the watchdog timer counter clear will not be performed. Then interrupt controller 46 will receive SSINT and send an interrupt to the processor (FIG. 7), along with the start of the interrupt response routine. This routine is shown in FIG. 11.

Figure 11:
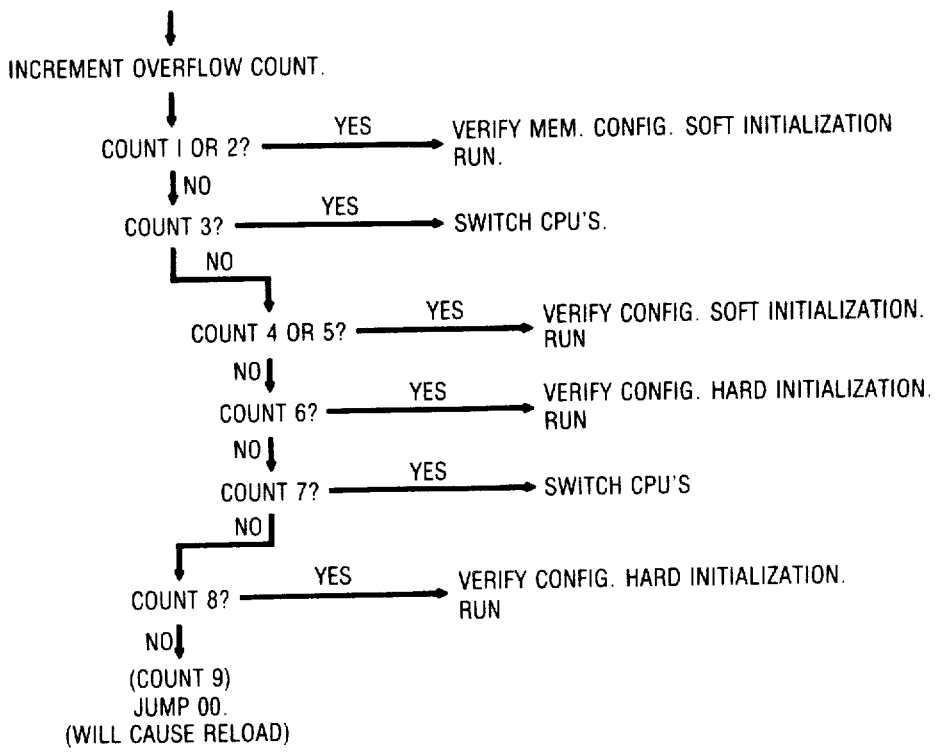
FIG. 11 is a flow chart of a processor routine for responding to hardware watchdog timer overflow.

As shown in FIG. 11 on the first or second hardware watchdog timer overflow interrupt the CPU takes steps to verify the memory configuration and then executes a soft initialization. This means that the processor directs an initialization from protected memory, of those portions of the scratch (unprotected, nonprogram areas) memory which can be initialized while saving the stable call connections made by the system.

On the third overflow count, the limit has been reached for switching CPU copies. Switching automatically causes a fourth overflow. In response to the fourth and fifth overflows, the CPU having been switched, the configuration is again verified and soft initializations are performed.

On the sixth overflow count, a hard initialization is performed. This means that the processor directs an initialization from protected memory of scratch memory without regard to saving stable calls.

On the seventh overflow count, the CPU's are switched back. This causes the eighth count, whereupon a further hard initialization is performed. If further overflows occur, the processor jumps to location 0000. This will result in a reload of all the processors, because of the operation of a feature called the software watchdog timer.

The soft initialization must skip certain areas of memory, as follows. In the State processor, the Reference Memory contains the map of the connections between lines, currently made by the switching system. In the Line processor, the Line State Map and Line State Pointers must be saved. In the Trunk processor, the Trunk State Map and Trunk State Pointers are saved. In the Data Base processor, the Busy-Idle Table is not reloaded. In addition to these areas in the control complex, there should not be an initialization in the switching network of low level multiplexer attenuations or of the connection memory.

Software Watchdog Timer

The data base processor will record a software watchdog timer overflow for a particular processor if it does not receive a punch-in message within four seconds of the last such punch-in message from that processor. Therefore, if one of the processors becomes confused, caught in a loop, or otherwise disabled so that it cannot punch-in with the data base processor, a software timer error will be recorded. An individual processor may be undertaking its own localized recovery procedures, such as those described in connection with the RDPE and the hardware watchdog timer overflow.

In some cases, these procedures will allow the processor to recover. However, once the processor has missed several consecutive punch-ins, for example five, it is believed that it is not going to recover on the basis of its localized procedures. Accordingly, after five consecutive missed punch-ins, the data base processor generates an overflow count. The levels of handling these overflow counts will be discussed in connection with FIG. 12.

Referring to FIG. 11, the last step of the hardware watchdog timer overflow routine, JUMP 00 serves to interact with the software watchdog timer in the following way. In all the processors except the data base processor, jumping to the 00 address causes the processor to become caught in the loop and thereby fail to punch-in with the data base processor. In the case of the data base processor, the 00 address begins a reload routine, thereby having the effect of a software watchdog timer overflow.

Figure 12:
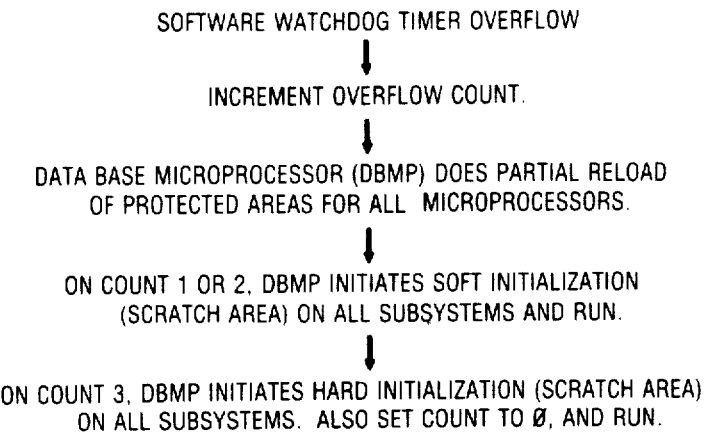
FIG. 12 is a flow chart of steps for responding to software watchdog timer overflow.

In FIG. 12, the software watchdog timer overflow count is incremented each time five consecutive punch-ins are missed. Then the data base processor does a partial reload, that is using block parity, of the protected (program) areas of all the processors. Then for the first two occurrences of overflow counts, the data base processor initiates a soft initialization in all the processors. It will be remembered that this involves the scratch or nonprogram area of memory, except for the reference memory containing stable call information.

On the third overflow count, the partial reload of the protected areas is again performed for all the processors. Then the data base processor initiates a hard initialization on all the processors. That is, there is an initialization of the scratch area, without regard to saving stable calls. The overflow count is set to 0.

If software watchdog timer overflows persist, the system will simply loop through the routine of FIG. 12. A craftsperson can manually initiate a total initialization of all parts of all memories, without regard to block parity in a final attempt to permit the system to recover.

In a particular implementation of the present invention, switches are provided by which the reloads of FIG. 12 can be selected to be total rather than partial and the initializations can be hard or soft. That is, if a block is to be reloaded from disk, the reload is actually done regardless of the fact that the block parity might be good. This has an advantage in that errors in multiples of two can occur in the same block in such a way as to yield good block parity.

Block Parity Checking and Reloading

Figure 13:
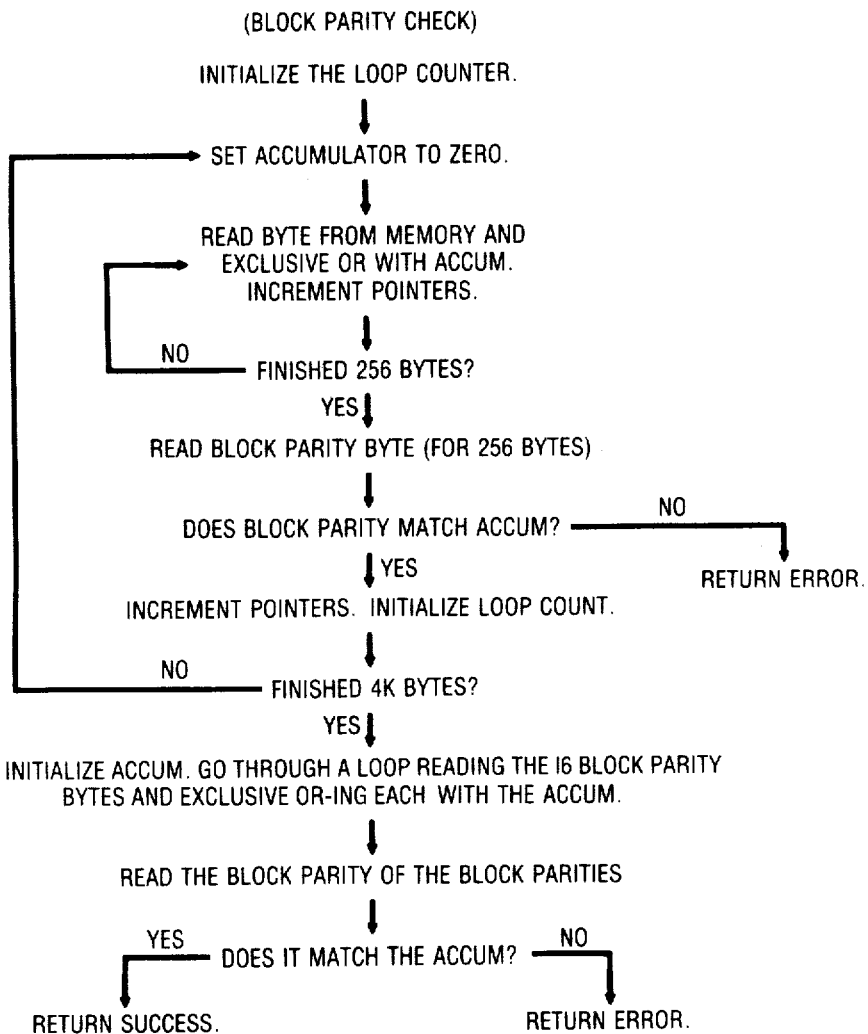
FIG. 13 is a flow chart of steps for performing a block parity check.

FIG. 13 illustrates the block parity operation which is used in initializing procedures administered by the data base processor. Each block of 256 bytes in the memory of a processor has associated with it a block parity byte. The block parity byte is computed by a procedure which is duplicated in the block parity check. As shown in FIG. 13, after the accumulator is initialized at 0, each of the 256 memory bytes is in turn exclusive OR'ed with the accumulator. After this has been done for all 256 bytes, the contents of the accumulator should match the block parity byte. If it does not match, then an error is noted. After 16 such block of 256 bytes have been checked and no errors found, the block parity bytes themselves are checked against a separate byte which is the block parity of the block parities. If this also matches, then a success message is returned.

Figure 14:
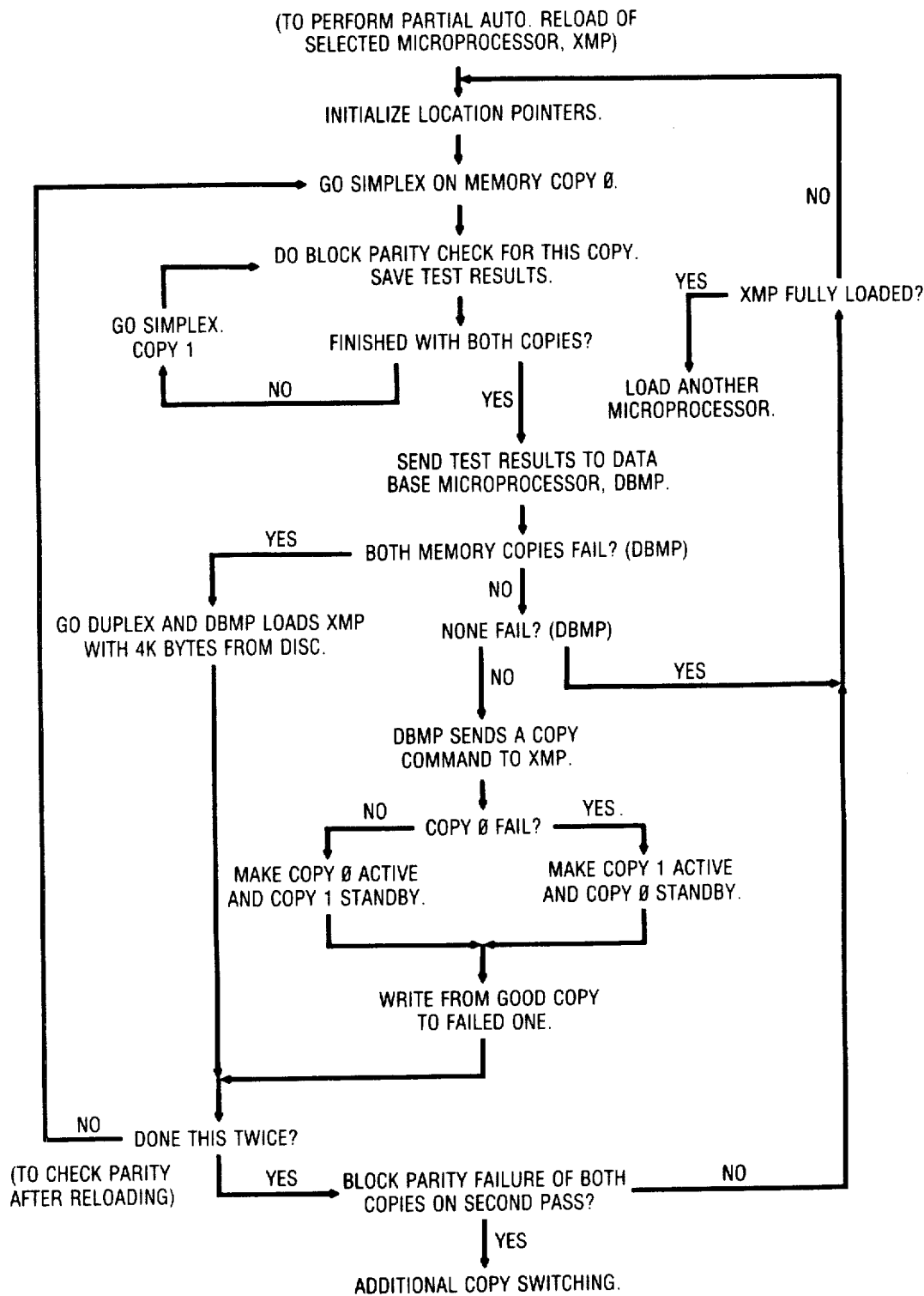
FIG. 14 is a flow chart of steps for performing a partial automatic reload of the memory of a processor.

As will be seen from a consideration of FIG. 14, basically if the block parity check is successful for both active and standby copies of a processor memory, then the system avoids having to reload the 4K bytes checked from disc. This can result in a considerable time saving in a recovery procedure, greatly diminishing the impact of the recovery procedures on the telephone users of the switching system.

FIG. 14 shows how the processor makes use of the results of the block parity check in performing initializations from the disc. Some of the steps of FIG. 14 are indicated as being performed by the data base microprocessor (DBMP). All the other steps are performed by the microprocessor being initialized, represented in the figure as XMP. In the case that the data base processor is being initialized, all the steps are performed by it.

The block parity check is performed for both copies of memory for the processor XMP. If both copies fail, the data base processor directs loading from disc of the four K bytes checked. Then the block parity test is run again to check the effectiveness of the reloading.

If one of the memory copies passes the block parity check and the other one fails, then a reload from disc can be avoided by writing from the good memory copy to the one which failed. As with the load from disc, the block parity check is run again after this write from one memory copy to another in order to determine if the parity problems were solved.

If both of the memory copies pass the block parity check, then there is no need for a rewrite at all. The system can go onto the next 4k bytes or the next processor, as appropriate. If there is a block parity failure of both memory copies on the second pass through the block parity check, then there is a major problem, which must be confronted through copy switching, such as between active and standby CPU's.

Routine Checking of Standby Memory

In the procedures described above, it would be highly advantageous to know that the standby unit is in proper working order, when a copy switch is commanded. In the case of memory units, it is advantageous to the integrity of stable calls, if it is assured that the contents of the standby memory are correct. It has been conceived that this can be achieved by a processor checking its memory, a part at a time, in periods when it is not occupied with call processing tasks. It has further been conceived that this can be economically accomplished by using software means, rather than hardware. The hardware approach to checking memory contents is to provide five additional, error detecting and correcting bits for each eight data bits. It is apparent that this can considerably increase the expense of the processor hardware.

Figure 15:
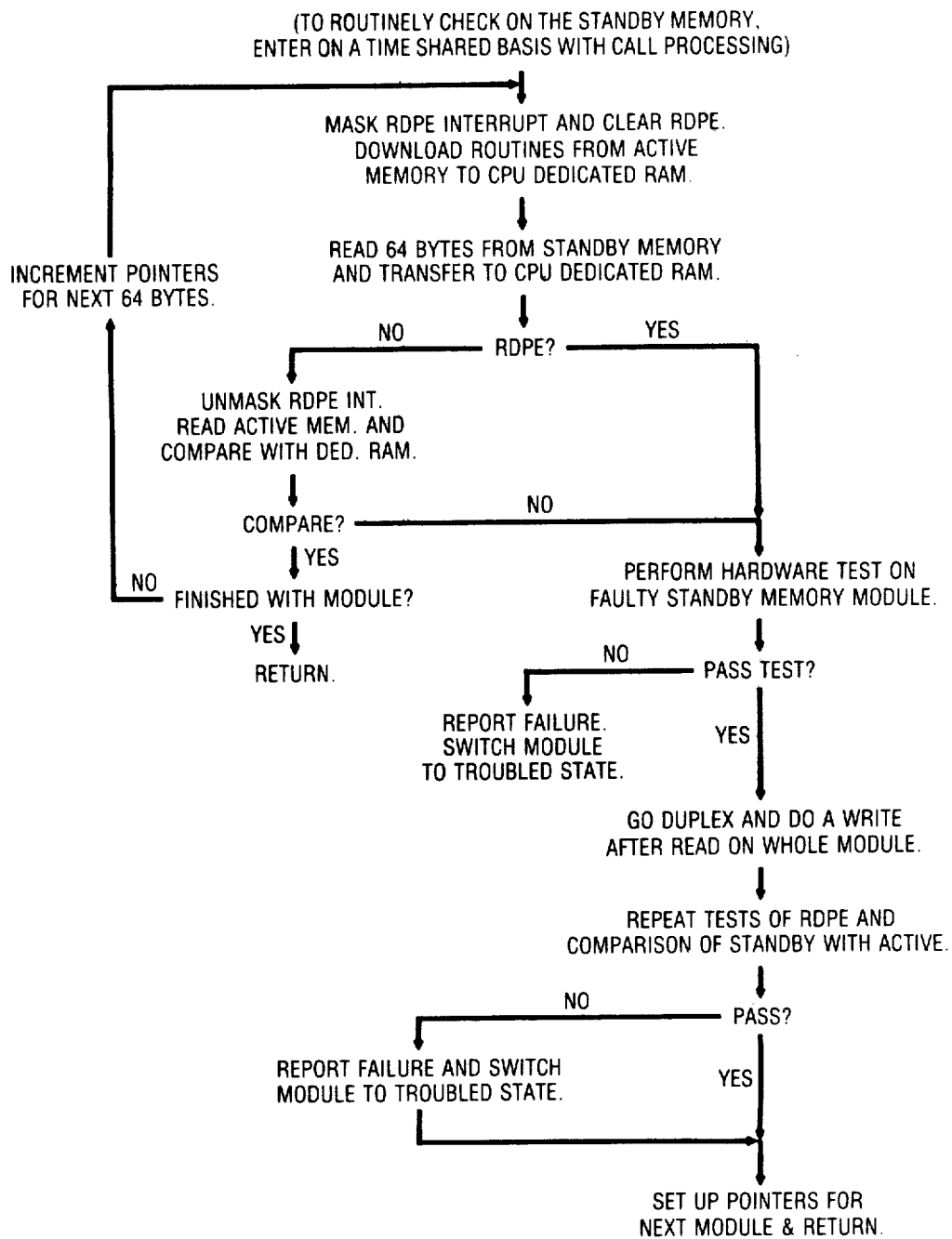
FIG. 15 is a flow chart of steps for routinely checking on standby memory.

Steps for checking the standby memory are shown in FIG. 15. As stated above, these steps are performed for small sections of the memory on a time shared basis with call processing. First the RDPE interrupt is masked and the RDPE latch cleared. If the checking routing discovers a parity error in reading the standby memory, it is important not to generate an interrupt which the CPU would interpret as coming from the active memory copy.

Some of the standby memory check routines are copied into the CPU dedicated RAM from active memory. It will become necessary in reading from the standby memory to go to simplex operation with respect to the standby unit, thereby cutting off the CPU from its routines stored in the active memory copy. Moreover, when an active-standby comparison is performed, involving that part of memory containing the memory check routines themselves, it is important to be comparing static versions of the memory contents, without changing flags, pointers etc.

The CPU reads a section of memory, for example, 64 bytes from the standby memory and transfers it to the dedicated RAM associated with the CPU. The RDPE latch is checked. If there is no return data parity error, the RDPE interrupt is unmasked and the CPU begins the process of reading the comparable portion of active memory and comparing it with the contents of the dedicated RAM.

If the reading from the standby memory does yield a return data parity error, or if there is a noncompare between the contents of the dedicated RAM and active memory, then the CPU commands performance of hardware tests on the standby memory module in question. If the module fails the hardware test, then this failure is reported and the module is switched to the troubled or nonoperative state. If, however, the hardware test is passed, then the processor returns to duplex operation and performs a write after read (from the active copy) on the whole memory module concerned.

Following the write after read, the standby memory is again checked, noting RDPE and a comparison with the active copy. If it fails again, the failure is reported and the module is switched to the troubled state. If the tests are passed this time, it is assumed that the contents have been corrected and that this section of the standby memory is ready to go active if necessary.

CONCLUSION

The overall organization of the fault recovery described in the present application has been called an outer bound concept. Beginning with the detection of the most localized errors, the system attempts to effect recovery by means and methods which are themselves as localized as possible. In those cases where repeated occurrences of the error indicate that the scope of the fault is exceeding the outer bound which can be dealt with by one level of recovery method, the system initiates the next, less localized level of recovery method. In pursuing this approach to recovery, we believe we have found a method of effecting the recovery in a large number of cases without significant impact on calls handled by the switching system, and in other cases recovery is attained with some disruption, but without losing stable calls.

The system for dealing with the occurrences of return data parity errors by corrective rewrites and maintaining a running error count result in the ability to appropriately reconfigure the system in response to soft faults, without overreacting. The use of partial reloading of memory by block parity checking has provided a recovery speed which minimizes the interruption of calls through the switching system. The use of time shared routine software error detection and correction economically assures that the standby memory copy in each processor is ready to begin operation if needed.

We claim:

1. In a control complex, for a call switching system, which includes multiple processors each having a processing unit and a memory unit, with at least one of said units having an active and a standby copy thereof, the improvement comprising:

means for responding to an indication of an error in one of said processors by rewriting a limited portion of the memory unit of said one processor;

means, upon a subsequent indication of an error in said one processor and if said processor includes an active and a standby copy, for switching said included standby copy to active status and said included active copy to standby status;

means, upon a further indication of an error in said one processor, for substantially initializing the memory units of all said processors, excepting areas necessary to save stable calls connected by said system; and means upon a still further indication of an error in said one processor, for substantially initializing the memory units of all of said processors, without excepting said areas necessary to save stable calls.

2. The improvement of claim 1, wherein said means for substantially initializing excepting areas necessary to save stable calls includes means for computing, prior to the time of said initializing, a block parity number for each of plural blocks of data stored in the memory units of said processors and storing said block parity numbers in said memory units, and means for computing the block parity numbers of blocks of data in storage in said memoy units at the time of said initializing and comparing the parity numbers computed at the time of initializing with the block parity numbers stored in said memory units, thereby assessing the necessity to initialize individual blocks of said memory units.

3. In a call switching system control complex, which includes multiple processors each having a processing unit and a memory unit, with at least one of said memory units having an active and a standby copy thereof, a fault recovery system comprising:

means, responsive to the processing unit in one of said processors reading data from a selected location in the active copy of an associated memory unit, for generating a return data parity error indication when the data read contains a parity error;

means for reading standby data from a location, in the standby copy of the associated memory unit, corresponding to said selected location in the active copy and writing the standby data into said selected active copy location; and means upon a subsequent return data parity error indication in said one processor for switching the standby copy of the memory unit thereof, as available, to active status and the active copy thereof to standby status.

4. In a call switching system control complex, which includes a processor having a processing unit and a memory unit, with said memory unit having an active and a standby copy thereof, each with stored contents, a fault recovery system assuring that said standby copy is in condition to become active when required, comprising:

means, operational in the presence of ongoing call switching by said system, upon determination that call switching activities are presently not required of the processor, for initiating reading and storing a multiple byte portion of the contents of said standby copy;

means for comparing said portion read and stored with the contents of the comparable portion of said active copy; and means, in the event said portions do not compare, for correcting the standby copy by writing contents of the active copy to the standby copy.

5. In a call switching system control complex which includes multiple processors each having a processing unit and a memory unit with data written therein, with at least two of said units, including one of said processing units having active and standby copies thereof, a fault recovery system comprising:

means for responding to an indication of an error in one of said processors by rewriting a portion of the memory unit of said one processor;

means for recording the occurrence of said indication of an error and, upon a subsequent indication of an error in said one processor, for switching a standby copy therein, as available, to active status and the corresponding active copy to standby status; and means, upon a different indication of an error in said one processor, for rewriting a portion of each of the memory units of all said processors.

6. The recovery system of claim 5, wherein said means for rewriting a portion of each of the memory units of all said processors includes means for loading protected areas of said memory units, at least any block of said protected areas which appears to contain an error.

7. The recovery system of claim 5, wherein said means for rewriting in all said processors includes means for loading a portion of each of the memory units of all said processors, including means for computing prior to the time of said loading, a block parity number for each of plural blocks of data stored in the memory units of said processors and storing said block parity numbers in said memory units and means for computing at the time of said loading, the block parity numbers of blocks of data actually in storage in said memory units and comparing the parity numbers computed at the time of loading with the block parity numbers actually stored in said memory units, thereby assessing the necessity to loading individual data blocks in said memory units.

8. The recovery system of claim 5, including software watchdog timer means for generating said different indication of an error in said one processor, when not reset by said one processor within a preselected period.

9. The recovery system of claim 6, further including means, upon multiple occurrences of said different error indication, for keeping count of said occurrences and, so long as said count is less than a first selected number, substantially initializing unprotected areas of the memory units of all said processors, excluding those sections of the memory units which should contain information necessary to save stable calls connected by the switching system.

10. The recovery system of claim 6, wherein said means for loading includes means for computing, prior to the time of said loading, a block parity number for each of plural blocks of data stored in said protected areas and storing said block parity numbers in said memory units, and means for computing, at the time of said loading, the block parity numbers of blocks of data actually in storage in said protected areas and comparing the parity numbers computed at the time of loading with the block parity numbers actually stored in said memory units, thereby assessing the necessity to loading individual data blocks in said protected areas.

11. The recovery system of claim 9, further including means, upon said count being equal to a second selected number, for substantially initializing unprotected areas of the memory units of all of said processors, including those sections thereof which may contain information necessary to save stable calls connected by the switching system.

12. The recovery system of claim 5, further including means, upon another indication of an error in said one processor, for substantially initializing the memory units of all said processors, excluding those sections thereof which should contain information necessary to save stable calls connected by the switching system.

13. The recovery system of claim 12, further including means, upon yet another indication of an error in said one processor for substantially initializing the memory units of all said processors, including those sections thereof which may contain information necessary to save stable calls connected by the switching system.

14. The recovery system of claim 5, wherein said means for recording and switching includes means for keeping a count of said indications of an error and for initiating said switching so that said subsequent indication of an error corresponds to a selectable count of said error indications.

15. The recovery system of claim 14, wherein said means for keeping a count and initiating switching accumulates a count and initiating switching of error indications arising from different sources.

16. The recovery system of claim 5, further including means, upon said different indication of an error in said one processor having experienced said switching, for establishing correct loading of protected areas of the memory units of all said processors, said establishing means comprising:
   memory means, in addition to said memory units, associated with a particular one of said processors,
   means for testing a block of a protected area in the active and standby copies of the memory unit of a selected processor for the appearance of an error, and
   means in said selected processor, when said test reveals that a protected area block in one of the copies of the memory unit of the selected processor appears to contain an error, while the other copy thereof does not, for writing the block which appears not to contain an error into the copy which appears to contain the error.

17. The recovery system of claim 16, further including means in said particular processor, upon a determination that a protected area block appears to contain an error in both copies of the memory unit of said selected processor, for loading the protected area block from said memory means into the memory unit of the selected processor.

18. In a call switching system control complex which includes multiple processors each having a processing unit and a memory unit, with at least one of said memory units having an active and a standby copy thereof, a fault recovery system comprising:
   means for generating a return data parity error indication when one of said processing units reads data containing a parity error from a selected location in the active copy of an associated memory unit;
   means for designating a fault giving rise to the error indication as being hard or soft, including
   means for reading standby data from a location, in the standby copy of the associated memory unit, corresponding to said selected location in the active copy and writing the standby data into said selected location of said active copy,
   means for rereading from said selected location in said active copy, and
   means for classifying said fault as hard upon the occurrence of a return data parity error indication accompanying said rereading, and for classifying said fault as soft in the absence of said occurrence.

19. The recovery system of claim 18 further including means, upon the designation of said fault as hard in said one processor memory unit, for switching the standby copy thereof, if available, to active status and the active copy thereof to standby status, and
   means for keeping an error count associated with said one processor and for incrementing said error count upon the designation of said fault for said one processor as soft.

20. The recovery system of claim 18, wherein said means for reading and writing standby data includes means for additionally rereading from said selected active copy location and checking for another return data parity error indication, prior to performing said reading of said standby data.

21. In a call switching system control complex, which includes multiple processors each having a processing unit and a memory unit, with at least one of said memory units having an active and a standby copy thereof and at least one of said processing units having an active and a standby copy thereof, a fault recovery system comprising:
   means for generating a return data parity error indication in one of said processors, when the processing unit thereof reads data containing a parity error from a selected location in the active copy of an associated memory unit;
   means for designating a fault giving rise to the error indication as being hard or soft, including means for reading standby data from a location, in the standby copy of the associated memory unit, corresponding to said selected location in the active copy and writing the standby data into said selected active copy location;
   means, upon the designation of said fault as hard in said one processor memory unit, for switching the standby copy thereof to active status and the active copy thereof to standby status;
   means, upon the designation of said fault as soft, for keeping a count of the occurrences of said indication of an error associated with a soft fault; and
   means, upon reaching a selectable count of said error indications associated with a soft fault in said one processor, for switching the standby copy of the memory unit thereof, as available, to active status and the active copy thereof to standby status.

22. The recovery system of claim 21, further including means upon a particular count of said error indications associated with a soft fault in said one processor, for switching the standby copy of the processing unit thereof, as available, to active status and the active copy thereof to standby status.

23. In a call switching system control complex, which includes multiple processors each having a processing unit and a memory unit, with at least one of said processors having processing unit copies classified according to operational status as active and standby copies, a fault recovery system comprising:

hardware watchdog timer means, associated with one processor having said copies, for generating an overflow indication whenever the timer means is not reset by the action of said one processor within a predetermined interval;

means for keeping a count of occurrences of said overflow indications;

means upon occurrence of one of said overflow indications and when the count of such indications is less than a first preselected number, for initializing a portion of the memory unit of said one processor; and means, upon the count of said overflow indications becoming equal to said preselected number, for switching the standby copy of the processing unit of said one processor to active status and the active copy thereof to standby status.

24. The recovery system of claim 23, further including means, upon said count of overflow indications being greater than said first preselected number and less than a second preselected number, for initializing a portion of the memory unit of said one processor, excluding those sections thereof which should contain information necessary to save stable calls connected by the switching system.

25. The recovery system of claim 24, further including means, upon said count of overflow indications being equal to said second preselected number, for initializing a portion of the memory unit of said one processor, including those sections thereof which may contain information necessary to save stable calls connected by the switching system.

26. The recovery system of claim 25, further including means, upon the count of said overflow indications being equal to a third preselected number, for switching the standby status copy of the processing unit of said one processor to active status and the active-status copy thereof to standby status.

27. The recovery system of claim 26, further including means, upon the count of said overflow indications being equal to a fourth preselected number, for initializing a portion of the memory unit of said one processor, including those sections thereof which may contain information necessary to save stable calls connected by the switching system, and means, upon the count of said overflow indications becoming equal to a fifth preselected number, for taking action to elicit corrective steps other than by said one processor.

28. In a call switching system control complex, a fault recovery system comprising:

a processing unit;

first and second bus multiplexers, each in communication with said processing unit, and each of said bus multiplexers having associated exclusively therewith one or more memory units, each switchable to active or standby status, thereby providing for one memory unit associated with one of the multiplexers to be an active copy, corresponding to a standby copy memory unit associated with the other multiplexer;

bus configuration means under the control of said processing unit for permitting said processing unit to write to both said bus multiplexers in a duplex mode or to a selected one of said multiplexers in a simplex mode;

means for generating an indication of an error related to said memory units;

means for responding to said indication of an error by writing from the standby copy, of a particular memory unit associated with one of said bus multiplexers, to the active copy thereof, by commanding simplex operation between the processing unit and the bus multiplexer associated with the particular memory unit standby copy, commanding the particular memory unit standby copy to active status, reading from the memory unit copy with changed status, restoring the memory unit copy read from to standby status, commanding duplex operation between the processing unit and the bus multiplexers, and writing to both copies of the particular memory unit; and means, upon a subsequent indication of an error, for switching a standby copy of said memory units to active status and the corresponding active copy to standby status.

29. The fault recovery system of claim 28, wherein said means for switching upon a subsequent indication of an error includes means for:

commanding simplex operation between said processing unit and the bus multiplexer associated with a first copy of a selected memory unit, commanding said first copy from standby status to active status, commanding simplex operation between the processing unit and the bus multiplexer associated with a second copy of said selected memory unit, commanding said second copy from active status to standby status, and commanding duplex operation between the processing unit and the bus multiplexers.

* * * * *